United States Patent [19]

Sakemi

[11] Patent Number: 5,680,984
[45] Date of Patent: Oct. 28, 1997

[54] APPARATUS AND METHOD FOR MOUNTING SOLDERING BALLS ONTO SURFACES OF ELECTRONIC COMPONENTS

[75] Inventor: Shoji Sakemi, Fukuoka, Japan

[73] Assignee: Matsushita Electric Industrial Co., Ltd., Osaka, Japan

[21] Appl. No.: 439,948

[22] Filed: May 12, 1995

[30] Foreign Application Priority Data

May 13, 1994 [JP] Japan .................................. 6-099636
Jan. 31, 1995 [JP] Japan .................................. 7-013918

[51] Int. Cl.[6] .................................................. B23K 1/018
[52] U.S. Cl. .................... 228/246; 228/223; 228/180.22; 118/425
[58] Field of Search ............................ 228/223, 224, 228/246, 180.22, 35; 118/501, 425

[56] References Cited

U.S. PATENT DOCUMENTS 5,284,287  2/1994  Wilson et al. ...................... 228/180.22
5,330,574  7/1994  Nakagawa et al. ................. 118/425 X

*Primary Examiner*—Kenneth J. Ramsey
*Attorney, Agent, or Firm*—Pollock, Vande Sande & Priddy

[57] ABSTRACT

An absorber head 10 picks up a plurality of soldering balls 1 from a container 2, and is shifted horizontally toward a substrate 31. In the midway of this shift movement, the absorber head 10 is stopped just above a flux storage 32 and then lowered to soak the soldering ball 1 in the flux 34 stored in the flux storage 32, thereby applying each soldering ball 1 with an adequate amount of flux. Thereafter, the absorber head 10 is again shifted horizontally until it reaches the substrate 31. Then, the absorber head 10 lowers the soldering ball 1 applied with flux, so that each soldering ball 1 is mounted on a corresponding electrode 31a provided on the substrate 31. If any soldering balls 1 are left in the flux storage 32 due to failure of the pickup operation by the absorber head 10, such soldering balls 1 are surely collected in a groove 36 by a wiping movement of a squeegee 37 which is associated with the flux storage 32.

12 Claims, 7 Drawing Sheets

$h0 = H - L - t0$
$h1 = H - L - t1$

# APPARATUS AND METHOD FOR MOUNTING SOLDERING BALLS ONTO SURFACES OF ELECTRONIC COMPONENTS

BACKGROUND OF THE INVENTION

1. Field of the Invention

This invention relates to an apparatus and a method for mounting solder balls onto surfaces of electronic components (workpieces) such as chips and substrates.

2. Prior Art

There is known a method of forming bumps (protruding electrodes) on an electronic component (i.e. workpiece), such as a chip and a substrate, by mounting soldering balls on electrodes formed on the electronic component, melting the soldering balls, and then hardening the molten solder. FIG. 11 is a side view schematically showing a conventional mounting apparatus for mounting soldering balls on electronic components. Soldering balls 101 are stored in a container 102. An absorber head 103, shiftable in an up-and-down direction, has a bottom surface having a plurality of openings. The absorber head 103 absorbs or picks up the soldering balls 101 by a suction force of vacuum when it is lowered and landed on the upper layer of soldering balls 101. Namely, the inside of the absorber head 103 is kept in a vacuum condition. Therefore, the soldering ball 101, when it approaches closely to any one of openings provided on the bottom surface of the absorber head 103, is forcibly captured in that opening by the suction force acting on it. During this absorbing operation, nitrogen gas or dry air is normally introduced into the container 102 to stir or mix up the soldering balls 101, thereby facilitating a vacuum absorption of the soldering balls 101.

The absorber head 103 is movable in a horizontal direction from the container 102 to a positioning clamper 104. The positioning clamper 104 clamps and mounts a substrate 105 on it. When the absorber head 103 comes just above this substrate 105, the absorber head 103 is lowered to unload the soldering balls onto the surface of the substrate 105.

To assure that each soldering ball 101 be adequately soldered on the substrate 105, what is generally required is to apply flux on the surface of the substrate 105 by means of a roller pin or the like prior to the above-described mounting operation of the soldering balls 101 onto the substrate 105. However, if the substrate 105 has a curvature on the surface, uniformly coating the surface of the substrate with flux may be unattainable. This deficiency possibly leads to a failure of the mounting operation of soldering balls 101.

SUMMARY OF THE INVENTION

Accordingly, in view of above-described problems encountered in the prior art, a principal object of the present invention is to provide an apparatus and a method for surely mounting soldering balls onto surfaces of electronic components (workpieces) such as chips and substrates, assuring that each soldering ball can be properly soldered or fixed on the workpiece with an adequate amount of flux.

In order to accomplish this and other related objects, a first aspect of the present invention provides a soldering ball mounting apparatus comprising: a container of soldering balls; a positioning means for positioning a workpiece; a holder head having a lower surface for picking up and holding at least one soldering ball stored in the container, and mounting the picked up soldering ball onto the workpiece placed on the positioning device; a shift means for shifting the holder head along a predetermined transportation path between the container and the positioning means; an ascend-and-descend means for lowering and raising the holder head; and a flux storage provided along the transportation path of the holder means, the flux storage comprising: a flat surface; a recess concaved from the flat surface; and a squeegee movable along the flat surface for spreading flux stored in the flux storage, thereby smoothing fluid surface of the flux stored in the flux storage.

In this soldering ball mounting apparatus, it is preferable that the recess has a capacity capable of collecting soldering balls dropped from the holder head onto the flat surface of the flux storage.

A second aspect of the present invention provides a soldering ball mounting method comprising steps of: positioning a workpiece having a surface on which at least one electrode is formed; storing flux in a flux storage having a flat surface and a recess concaved from the flat surface; moving a squeegee along the flat surface for spreading flux stored in the flux storage, thereby smoothing fluid surface of the flux stored in the flux storage; holding at least one soldering ball by a holder head; soaking the soldering ball held by the holder head into the flux stored in the flux storage, thereby applying flux to a lower part of each soldering ball; and mounting the each solder ball onto a corresponding electrode on the workpiece after the each solder ball is applied with flux.

A third aspect of the present invention provides a soldering ball mounting apparatus comprising: an absorber head for picking up and transporting soldering balls, the absorber head having at least one absorber hole for absorbing a soldering ball; a positioning device for positioning a substrate having a surface on which at least one electrode is formed; a flux storage for storing flux therein, provided along a transportation path of the absorber head, the flux storage comprising a flat surface and a recess concaved from the flat surface; a squeegee for spreading flux on the flat surface; a shift means for shifting the squeegee along the flat surface; and a level adjusting means for adjusting the height of a lower end of the squeegee by moving the squeegee in an up-and-down direction; the level adjusting means setting the height of the lower end of the squeegee at a second level when the squeegee moves toward the recess, while the level adjusting means setting the height of the lower end of the squeegee at a first level higher than the second level when the squeegee moves away from the recess, thereby forming a flux layer of a desired thickness on the flat surface.

A fourth aspect of the present invention provides a soldering ball mounting apparatus comprising: an absorber head for picking up and transporting soldering balls, the absorber head having at least one absorber hole for absorbing a soldering ball; a positioning device for positioning a substrate having a surface on which at least one electrode is formed; a flux storage for storing flux therein, provided along a transportation path of the absorber head, the flux storage comprising a flat surface and a recess concaved from the flat surface; a shift plate supported on the flux storage and slidable in a horizontal direction along the flux storage; a shift means for shifting the shift plate; first and second squeegees supported on the shift plate, respectively shiftable in up-and-down direction with respect to the shift plate; a first ascend-and-descend means provided on the shift plate for lowering the first squeegee until a lower end of the first squeegee reaches a first level when the first squeegee moves away from the recess; and a second ascend-and-descend means provided on the shift plate for lowering the second squeegee until a lower end of the second squeegee reaches a second level lower than the first level when the second squeegee moves toward the recess.

In the above fourth aspect soldering ball mounting apparatus, it is preferable that the first squeegee and the second squeegee are differentiated in their lengths in the up-and-down direction by an amount identical with a difference between the first and second levels, and a stroke of the first ascend-and-descend means for lowering the first squeegee is identical with a stroke of the second ascend-and-descend means for lowering the second squeegee.

Alternatively, it is preferable that the first squeegee and the second squeegee are identical with each other in their lengths in the up-and-down direction, and a stroke of the first ascend-and-descend means for lowering the first squeegee is differentiated from a stroke of the second ascend-and-descend means for lowering the second squeegee by an amount identical with a difference between the first and second levels.

Furthermore, it is preferable that a gap between the second level and the flat surface is smaller than a diameter of the soldering ball.

A fifth aspect of the present invention provides a soldering ball mounting method comprising steps of: storing flux in a flux storage having a flat surface and a recess concaved from the flat surface; wiping the flux in the flux storage toward the recess by sliding a squeegee means along the flat surface; setting a height of a lower end of the squeegee means at a first level, and causing the squeegee means to slide along the flat surface so as to move away from the recess, thereby forming a flux layer of a desired thickness; holding at least one soldering ball by an absorber head; soaking the soldering ball held by the holder head into the flux stored in the flux storage, thereby applying flux to a lower part of each soldering ball; and mounting each solder ball onto a corresponding electrode formed on a workpiece after each solder ball is applied with flux.

In the above fifth aspect soldering ball mounting method, it is preferable, when the flux in the flux storage is wiped toward the recess by the squeegee means along the flat surface, that any soldering ball left on the flat surface is wiped together with the flux until the soldering ball drops into the recess.

Furthermore, the height of the lower end of the squeegee means is changed to a second level lower than the first level when the flux in the flux storage is wiped toward the recess by the squeegee means along the flat surface.

The squeegee means may be a single squeegee. Alternatively, the squeegee means can comprise first and second squeegees independent from each other, the first squeegee forming the flux layer of the desired thickness while the second squeegee is wiping the flux.

Moreover, a gap between the second level and the flat surface is smaller than a diameter of the soldering ball.

And, a sixth aspect of the present invention provides a soldering ball mounting method comprising steps of: forming a plurality of electrodes on a surface of a workpiece; storing flux in a flux storage having a flat surface and a recess concaved from the flat surface; flattening fluid surface of the flux on the flat surface by moving a squeegee along the flat surface; holding a plurality of soldering balls by a holder head; soaking the soldering balls held by the holder head into the flattened flux in the flux storage, thereby applying flux to a lower part of each soldering ball; and mounting each solder ball onto a corresponding electrode on the workpiece after the each solder ball is applied with flux.

With the above arrangement, the holder (or absorber) head picks up at least one soldering ball i from the container. The holder (or absorber) head is then shifted horizontally toward the workpiece such as a substrate. In the midway of this shift movement, the holder (or absorber) head is stopped just above the flux storage and then lowered to soak the soldering ball into the flux stored in the flux storage, thereby applying each soldering ball with an adequate amount of flux. Thereafter, the holder (or absorber) head is again shifted horizontally until it reaches the workpiece. Then, after the holder (or absorber) head lowers the soldering ball with flux, each soldering ball is mounted and soldered on a corresponding electrode provided on the workpiece. If any soldering ball is left in the flux storage due to failure of the pickup operation by the holder (or absorber) head, such soldering ball is surely collected in a recess (e.g. groove) by a wiping movement of a squeegee which is associated with the flux storage.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1:
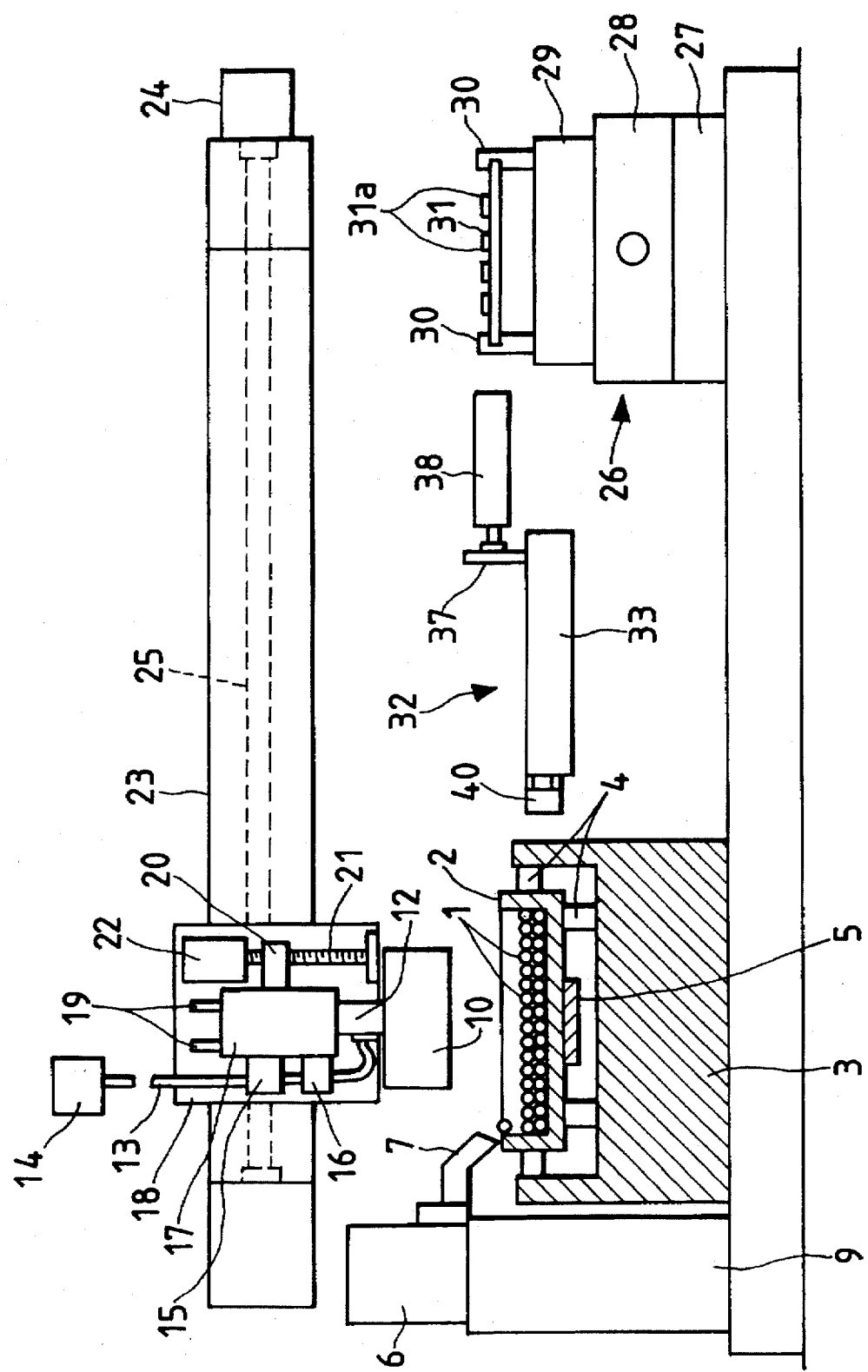
FIG. 1 is a side view schematically showing a structural arrangement of a soldering ball mounting apparatus in accordance with a first embodiment of the present invention.

Preferred embodiments of the present invention will be explained in greater detail hereinafter, with reference to the accompanying drawings. Identical parts are denoted by identical reference numeral throughout the views.

First Embodiment

Figure 2A:
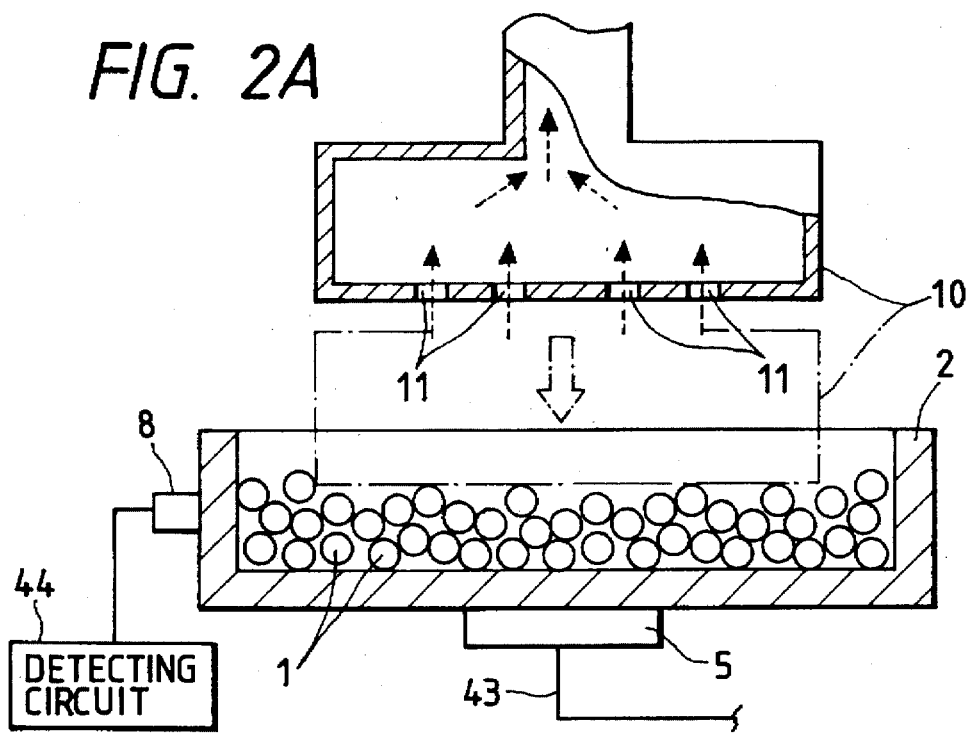
FIGS. 2A and 2B are cross-sectional views cooperatively illustrating the pickup operation of an absorber head equipped with the soldering ball mounting apparatus in accordance with the first embodiment of the present invention.
Figure 2B:
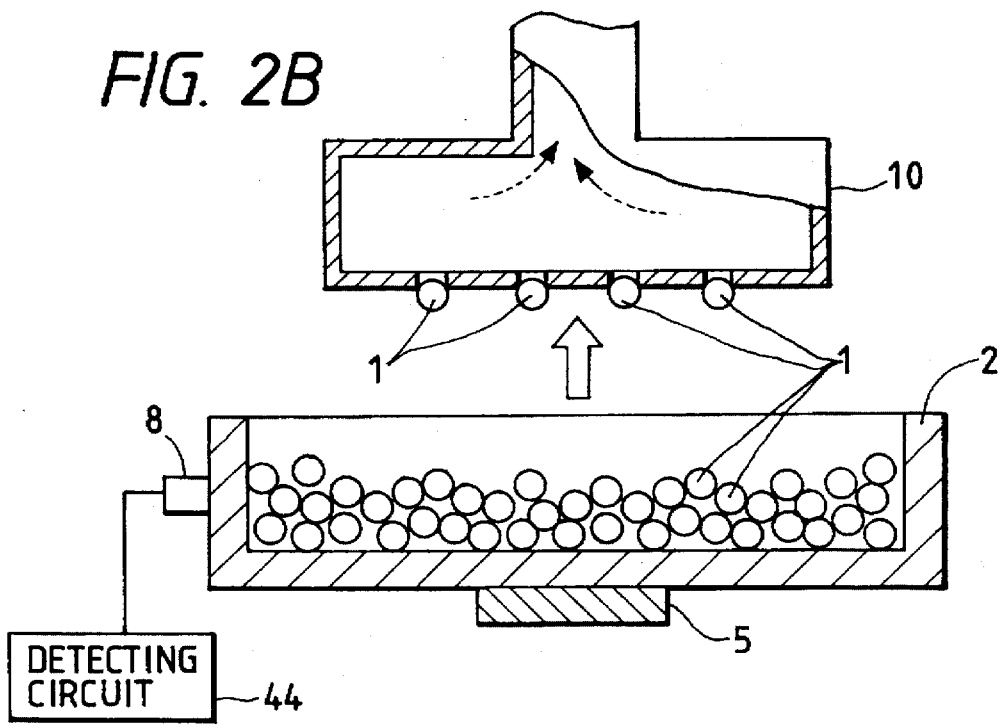
Figure 3:
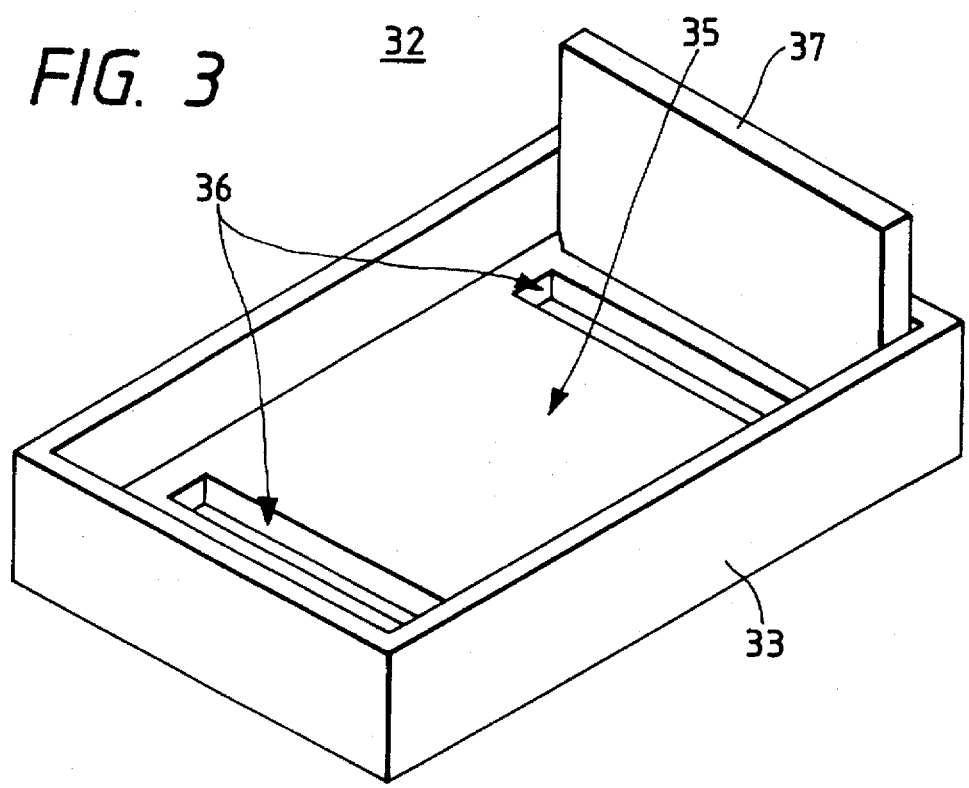
FIG. 3 is a perspective view showing a flux container equipped with the soldering ball mounting apparatus in accordance with the first embodiment of the present invention.
Figure 4:
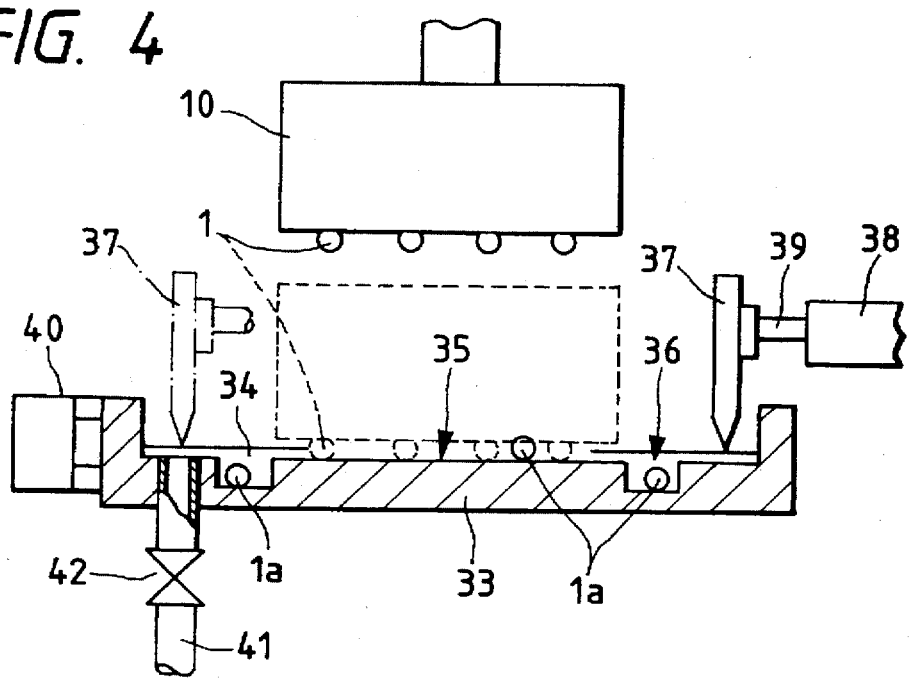
FIG. 4 is a cross-sectional view showing the flux container equipped in the soldering ball mounting apparatus in accordance with the first embodiment of the present invention.
Figure 5:
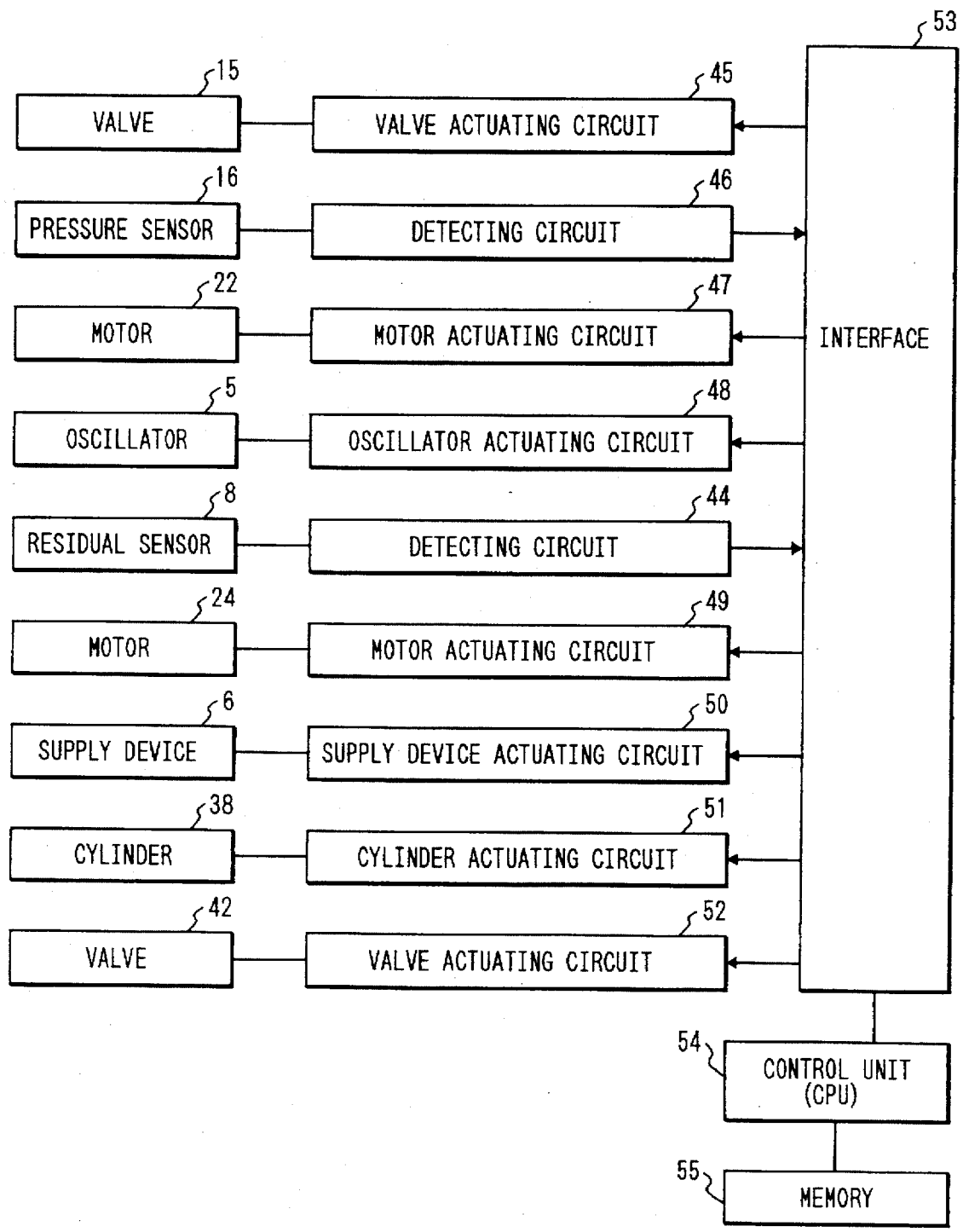
FIG. 5 is a block diagram showing a systematic arrangement of the soldering ball mounting apparatus in accordance with the first embodiment of the present invention.

FIG. 1 is a side view schematically showing a structural arrangement of a soldering ball mounting apparatus in accordance with a first embodiment of the present invention. FIGS. 2A and 2B are cross-sectional views cooperatively illustrating the pickup operation of an absorber head equipped in the soldering ball mounting apparatus in accordance with the first embodiment of the present invention. FIG. 3 is a perspective view showing a flux container equipped in the soldering ball mounting apparatus in accordance with the first embodiment of the present invention. FIG. 4 is a cross-sectional view showing the flux container equipped in the soldering ball mounting apparatus in accordance with the first embodiment of the present invention. And, FIG. 5 is a block diagram showing a systematic arrangement of the soldering ball mounting apparatus in accordance with the first embodiment of the present invention.

In FIG. 1, a container 2 is a storage storing soldering balls 1, in which a plurality of soldering balls 1 are stored and accumulated into multiple layers. A base 3 supports the container 2 by means of a plurality of elastic members 4, so the container 2 is displaceable in both a vertical direction and a horizontal direction when any force is given on it. A piezoelectric oscillator 5, acting as an ultrasonic oscillator means, is installed on the bottom surface of the container 2. This piezoelectric oscillator 5 causes ultrasonic oscillation when a high-frequency voltage is applied to it. This ultrasonic oscillation is directly transmitted to the container 2 and mixes up the soldering balls 1 stored in the container 2. By varying the high-frequency voltage applied, the magnitude of the ultrasonic oscillation transmitted to the container 2 can be adjusted.

A soldering ball supply device 8 supplies soldering balls 1 through a pipe 7. The container 2 is equipped with a residual sensor 8 (described in detail later) which detects the residual amount of soldering balls 1 in the container 2. When the residual sensor 8 detects the fact that the residual amount of soldering balls 1 is less than a predetermined amount, the soldering ball supply device 8 supplies soldering balls 1 into the container 2 in response to the detecting signal obtained from the residual sensor 8. The soldering ball supply device 8 is mounted on a base 9.

An absorber head 10 has a lower surface with a plurality of absorber holes 11. As shown in FIG. 2, absorber holes 11 are numerous openings communicating the inside space of the absorber head 10 to the outside. Each absorber hole 11 has a size suitable for just catching a soldering ball 1 at its circular peripheral edge. These absorber holes 11 are disposed in a matrix, so that the absorber head 10 can absorb the required number of soldering balls 1 at a time. The absorber head 10 is connected to a vacuum device 14 via a support shaft 12 and a tube 13. When the vacuum device 14 is operated, each absorber hole 11 sucks or absorbs a soldering ball 1 by the aid of vacuum.

A valve 15, provided in the tube 13, opens or closes a suction passage of the vacuum device 14. A pressure sensor 16, also provided in the tube 13, detects the magnitude of a given absorbing pressure (i.e. an applied vacuum pressure). In the present invention, the absorber head 10 serves as a holder head for holding soldering balls 1.

A holder block 17 of the absorber head 10 holds the absorber head 10 through the support shaft 12. A movable block 18 has a front surface on which two guide rails 19 are disposed in the vertical direction. The holder block 17 can be raised or lowered along the guide rails 19. A nut 20 is provided on the side wall of the holder block 17. A feed screw 21 is engaged with the nut 20 so as to extend in the vertical direction.

A motor 22, fixed on the movable block 18, drives the feed screw 21. In response to the rotation of the feed screw 21, the holder block 17 and the absorber head 10 are elevated or lowered along the guide rails 19. That is, the nut 20, the feed screw 21, and the motor 22 constitute an ascend-and-descend means for raising or lowering the absorber head 10.

The movable block 18, mounted on a shift table 23, is slidable in a horizontal direction along the shift table A motor 24 is attached on one end of the shift table 23. The motor 24, when it is driven, rotates a feed screw 25 accommodated in the shift table 23. The movable block 18, engaged with the feed screw 25, causes a lateral shift movement along the shift table 23 in response to the rotation of the motor 24. In short, the shift table 23 acts as a shift means for shifting the absorber head 10.

A positioning device 28 comprises an X table 27, a Y table 28 and a substrate holder 29 stacked in this order. The substrate holder 29 mounts a clamper 30 on the upper surface thereof. The clamper 30 holds a substrate 31 in position, so that the substrate 31 is firmly fixed above the substrate holder 29. The absorber head 10, driven along the shift table 23, goes and returns between the container 2 and the positioning device 26.

A flux storage 32 is provided in the midway of the path of the absorber head 10, i.e. along a transportation path on which the absorber head 10 moves back and forth for transporting the soldering balls 1 from the container 2 to the positioning device 26. The arrangement of the flux storage 32 will be explained in detail with reference to FIGS. 3 and 4. The flux storage 32 comprises a main body 33 shaped into a rectangular tray, in which a predetermined amount of flux 34 is stored. The base body 33 has a flat bottom surface 35. There are formed two grooves 36 in parallel with each other transversely at opposite ends of the bottom of the main body 33.

A squeegee 37 is associated with and provided in the main body 33. The squeegee 37 is a blade set transversely at one end of the main body 33, and used for spreading, pushing, or wiping flux off or across the flat bottom surface 35. The squeegee 37 is supported by a rod 39 of a cylinder 38. When the rod 39 is pushed forward, the squeegee 37 slides on the flat bottom surface 35 across the two grooves 36 from right to left in the drawing. On the other hand, when the rod 39 is retracted, the squeegee 37 returns from left to right. Namely, the cylinder 38 acts as an actuator for causing the squeegee 37 to move or slide in the horizontal direction. The lower end of the squeegee 37 is formed into a sharp edge and is positioned at a level slightly higher than the flat bottom surface 35 as shown in FIG. 4. By moving or sliding the squeegee 37 along the flat bottom surface 35, fluid surface of flux 34 is flattened or smoothed. The absorber head 10 may fail to surely absorb or hold the soldering balls 1 captured by the absorber holes 11 and thus may drop some of soldering balls (denoted by reference numerals 1a is FIG. 4) on the flat bottom surface 35. However, such soldering balls 1a are collected in the grooves 36 by the wiping movement of the squeegee 37. As clearly shown in FIG. 4, the position of the grooves 38 are offset from the lowered position of the absorber head 10.

A camera 40 is provided on the side wall of the main body 33. The side wall of the main body 33 is transparent, so that the camera 40 can detect a fluid level of the flux 34. If the fluid level drops below a predetermined level, flux 34 is supplied into the main body 33 by an appropriate supply means (not shown). A pipe 41 is connected to the main body 33. When a valve 42 provided in the pipe 41 is opened, the flux 34 is drained, thereby lowering the fluid level of the flux 34.

In FIG. 2A, the oscillator 5 is connected to a lead 43 through which a high-frequency voltage is applied to the oscillator 5. The residual sensor 8, made of an optical sensor, is provided on the side wall of the container 2. This container 2 is transparent, so that the level of soldering balls 1, i.e. the residual amount of the soldering balls 1, can be detected by the residual sensor 8. If the residual amount of the soldering balls 1 becomes smaller than a predetermined amount, new soldering balls 1 are successively supplied from the soldering ball supply device 6 to the container 2. A detecting circuit 44 is connected to the residual sensor 8.

In the block diagram of FIG. 5, the valve 15 provided in the suction passage of the vacuum device 14 is connected to a valve actuating circuit 45. Opening or closing of the valve 15 controls the vacuum absorption of the absorber head 10 or its release. The pressure sensor 18 detecting the vacuum absorbing force of the vacuum device 14 is connected to a detecting circuit 48. A motor actuating circuit 47 is connected to the motor 22 and actuates the same. An oscillator actuating circuit 48 is connected to the oscillator 5 and actuates the same. A motor actuating circuit 49 is connected to the motor 24 and actuates the same. A supply device actuating circuit 50 is connected to the supply device 6 and actuates the same. A cylinder actuating circuit 51 is connected to the cylinder 38 and actuates the same. A valve actuating circuit 52 is connected to the valve 42 and actuates the same. The above-described circuits 44–52 are connected to a control unit (i.e. CPU) 54 via an interface 53. The control unit 54 reads program data stored in a memory 55, and controls the above numerous circuits.

Next, an overall operation of the above-described soldering ball mounting apparatus will be explained in greater detail.

First of all, a plurality of electrodes 31a are formed on the upper surface of the substrate 31. The soldering balls 1 are to be mounted on these electrodes 31a. The substrate 31 is then fixed in position on the positioning device 26 by means of the clamper 30. Next, when the motor 22 is rotated forward, the absorber head 10 is lowered toward the container 2. Thereafter, in response to the actuation of the oscillator 5, the container 2 causes ultrasonic oscillation so that the soldering balls 1 stored in the container 2 can be sufficiently mixed up. When the absorber head 10 is properly lowered as shown by a long-and-short dash line in FIG. 2A, each absorber hole 11 absorbs a soldering ball 1 by aid of vacuum. Next, by rotating the motor 22 in the reverse direction, the absorber head 10 is raised together with soldering balls 1, thus picked up.

Then, in FIG. 1, the motor 24 rotates in the forward direction until the absorber head 10 arrives above the flux storage 32. Subsequently, by rotating the motor 22 in the forward direction, the absorber head 10 is lowered until the soldering balls 1 land on the flat bottom surface 35 as shown by a dot line in FIG. 4. In turn, the motor 22 is rotated in the reverse direction to raise the absorber head 10. The level of flux 34 is adjusted at a predetermined level so that each soldering ball 1 is soaked in the flux 34 by an adequate depth. The fluid surface of the flux 34 is flattened or smoothed by moving the squeegee 37 adequately to spread or wipe the flux 34. Thus, a sufficient amount of flux 34 is attached on the surface of each soldering ball 1 by lowering and raising the absorber head 10.

Next, the motor 24 resumes rotating in the forward direction. In response to the forward rotation of the motor 24, the absorber head 10 again shifts horizontally and arrives just above the substrate 31. Then, the motor 22 is rotated in the forward direction, so that the absorber head 10 is lowered, thereby mounting the soldering balls 1 onto the electrodes 31a formed on the substrate 31. Subsequently, the vacuum condition is released. Then, the absorber head 10 is lifted. And, the motor 24 is rotated in the reverse direction until the absorber head 10 returns to the home position just above the container 2. With an appropriate bonding force given by the flux 34, each soldering ball 1 can be firmly bonded on a corresponding electrode 31a on the substrate 31. After all the soldering balls 1 are bonded on the electrodes 31a, the substrate 31 is subjected to a thermal processing, thereby melting the soldering balls and forming bump electrodes as intended.

In such a mounting operation of soldering balls 1 onto the substrate 31, it should be noted that there is a possibility that the soldering ball 1 absorbed by the absorber head 10 may accidentally drop off the absorber head 10 and left on the flat bottom surface 35 as indicated by the reference numeral 1a in FIG. 4. Such soldering balls 1 left on the flat bottom surface 35 possibly become obstacles in the next soaking operation of the soldering balls 1. Namely, when the absorber head 10 is lowered to apply the soldering ball 1 with the flux 34, the absorber head 10 may collide with the soldering balls 1 left in the previous operations.

To avoid such collisions, the cylinder 38 is operated each time after the absorber head 10 is raised. More specifically, the squeegee 37 is reciprocated along the surface of the flat bottom surface 35, so that all the soldering balls 1 left on the flat bottom surface 35 can be collected in the grooves 38. Thus, any interference between the absorber head 10 and the dropped soldering balls 1 can be eliminated. In this manner, the squeegee 37 not only acts as a smoothing means for flattening the fluid surface of the flux 34 but functions as a collecting means for collecting the soldering balls 1 into the grooves 36.

If the diameter of the soldering ball 1 needs to be changed in accordance with alteration of type of the substrate 31, the fluid level of the flux 34 should be adjusted correspondingly to maintain an adequate soaking depth for each soldering ball 1. If necessary, to decrease the fluid level of the flux 34 or to exchange the flux 34 entirely, the valve 42 of FIG. 4 is opened to drain the flux 34. Although this embodiment discloses the substrate 31 as an example of the workpiece, it is needless to say that it can be replaced by another electronic component having electrodes formed on the surface thereof. Furthermore, the scope of the present invention allows various modifications in the design of the apparatus or system. For example, the container 2 is not limited to the disclosed one, and will be replaced by a jig capable of arraying soldering balls 1 in a flat layer.

Second Embodiment

Figure 6:
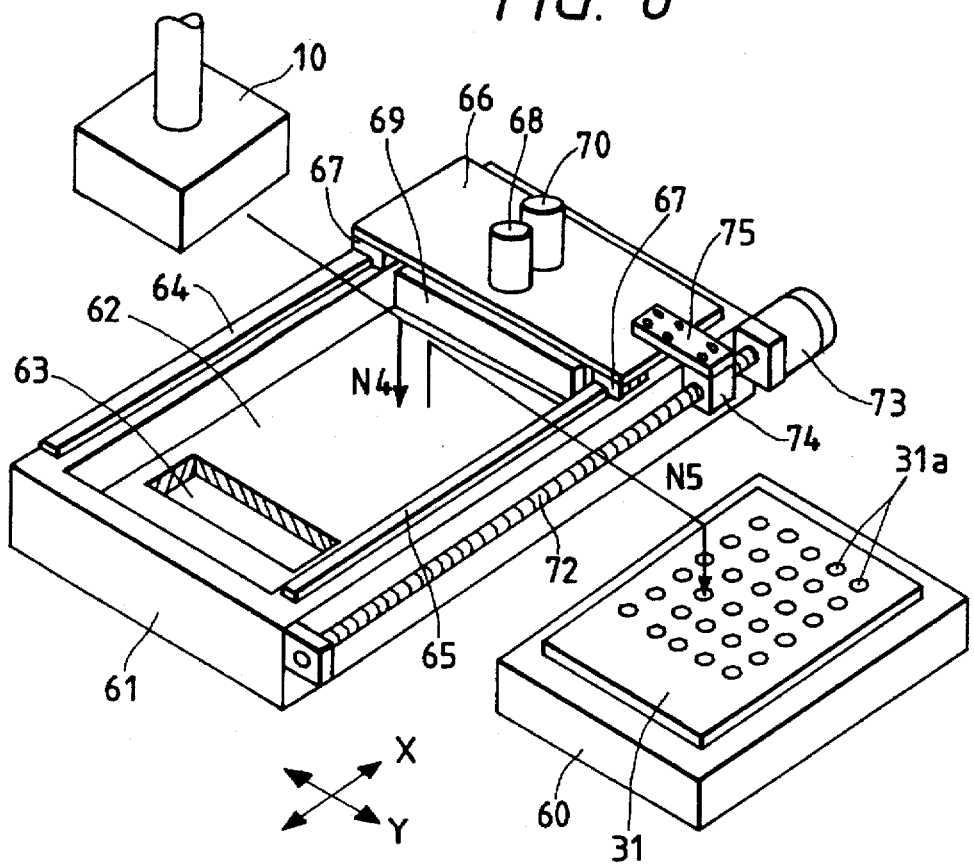
FIG. 6 is a perspective view showing another soldering ball mounting apparatus in accordance with a second embodiment of the present invention.
Figure 7:
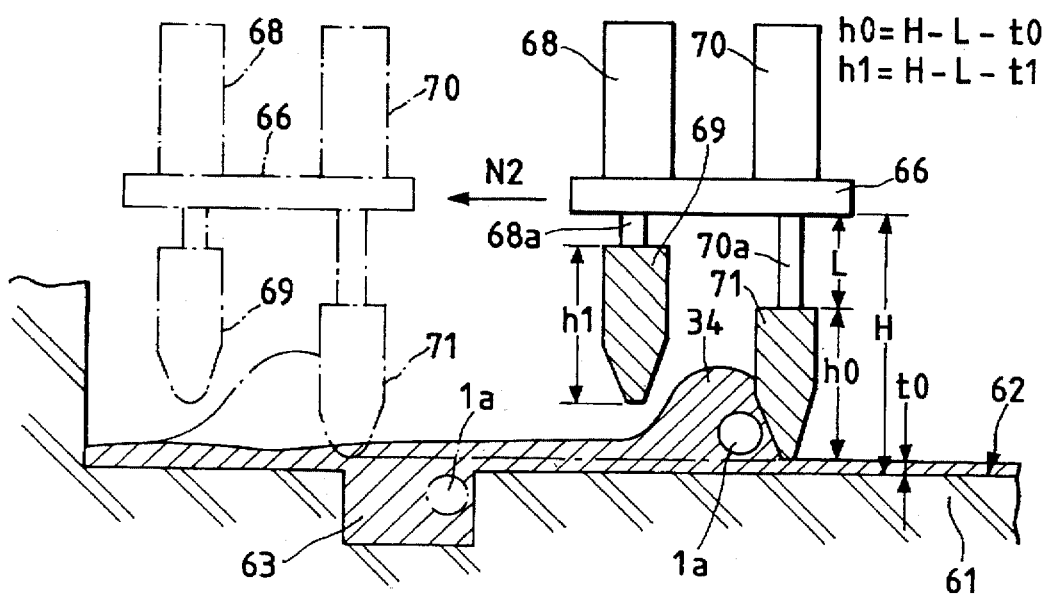
FIG. 7 is an explanatory view showing one process of a soldering ball mounting method in accordance with the second embodiment of the present invention.
Figure 8:
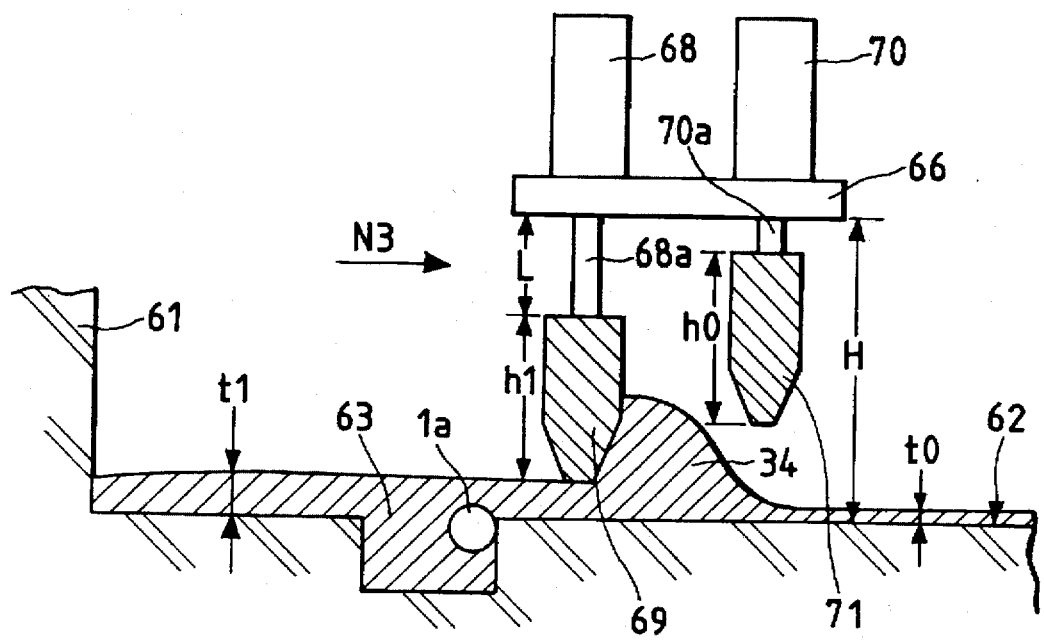
FIG. 8 is an explanatory view showing another process of the soldering ball mounting method in accordance with the second embodiment of the present invention.
Figure 9:
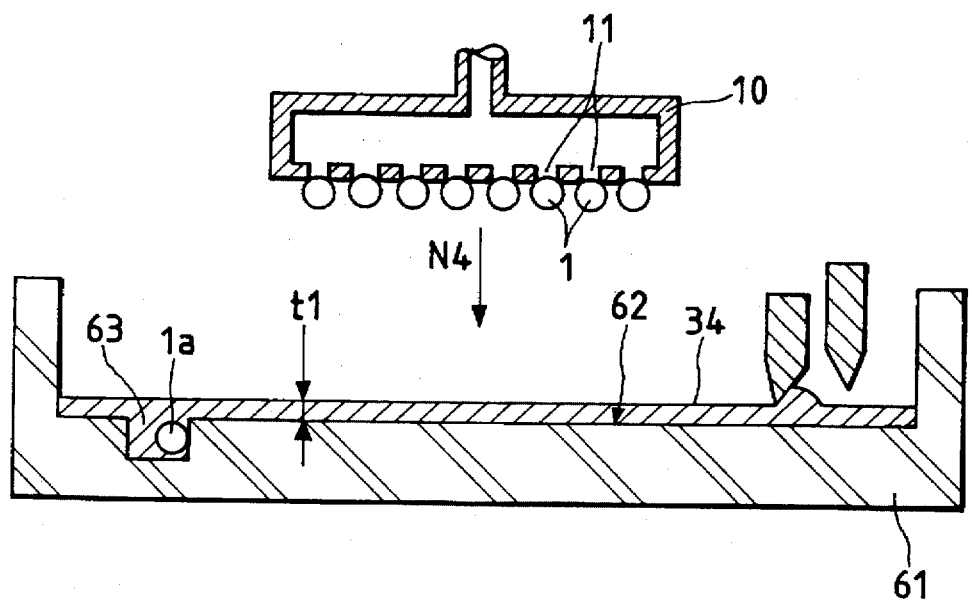
FIG. 9 is an explanatory view showing still another process of the soldering ball mounting method in accordance with the second embodiment of the present invention.
Figure 10:
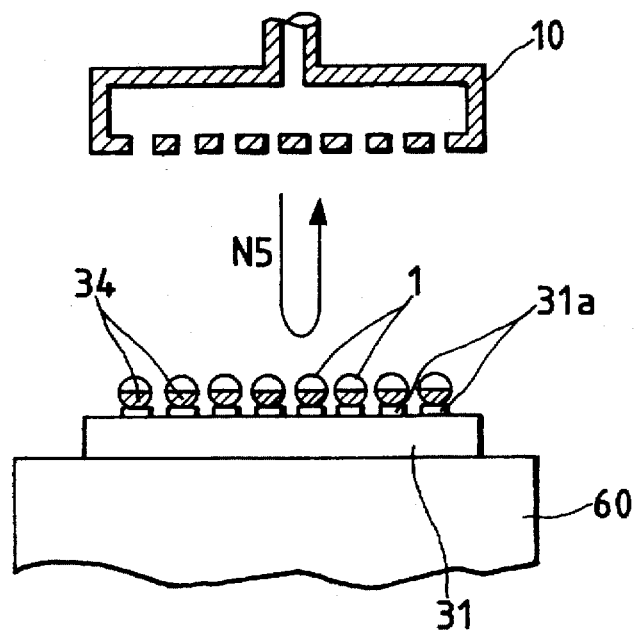
FIG. 10 is an explanatory view showing yet another process of the soldering ball mounting method in accordance with the second embodiment of the present invention.
Figure 11:
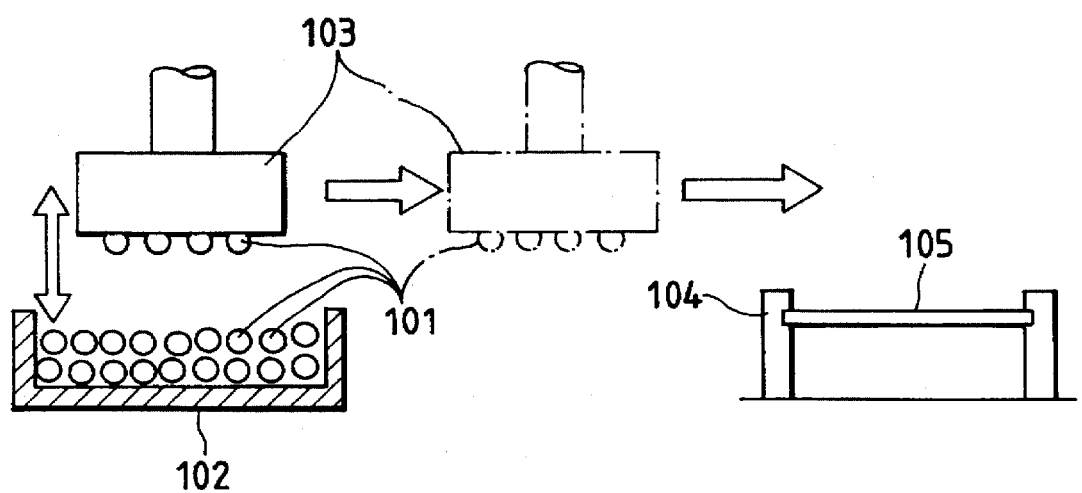
FIG. 11 is a side view schematically showing a conventionally available soldering ball mounting apparatus.

With reference to FIGS. 8 through 10, a second embodiment of the present invention will be explained below. FIG. 6 is a perspective view showing a soldering ball mounting apparatus in accordance with the second embodiment of the present invention. FIG. 7 is an explanatory view showing a process of a soldering ball mounting method in accordance with the second embodiment of the present invention. FIG. 8 is an explanatory view showing another process of the soldering ball mounting method in accordance with the second embodiment of the present invention. FIG. 9 is an explanatory view showing still another process of the soldering ball mounting method in accordance with the second embodiment of the present invention. And, FIG. 10 is an explanatory view showing yet another process of the soldering ball mounting method in accordance with the second embodiment of the present invention.

In FIG. 6, a positioning device 60 is provided for positioning a substrate 31. On the upper surface of the substrate 31, there are provided a plurality of electrodes 31a. A soldering ball 1, having been already applied with the flux 34, is to be mounted on a corresponding electrode 31a. A flux storage 61 is shaped in a rectangular tray having a flat bottom surface 62. A groove 63, recessed from the flat bottom surface 62, is formed transversely at an end of the longitudinal direction of the flat bottom surface 62. The groove 63, having a width wider than the diameter of the soldering ball 1, has a capacity capable of collecting the soldering balls 1. The flat bottom surface 62 is covered by the flux 34 whose thickness is maintained at a predetermined level by the squeegee.

A pair of guide rails 64 and 65 is provided at opposite ends of the flux storage 61 so as to extend in the longitudinal direction. A shift plate 66 is fixed on a pair of sliders 67 which are slidably engaged with the guide rails 64 and 65. A first cylinder 68, acting as a first ascend-and-descend means, is fixed on the shift plate 66. The first cylinder 68 has a rod 68a having a lower end fixed to a first squeegee 69 which is brought into contact with the flux 34 on the flat bottom surface 62 when it is shifted to a lowermost position. A second cylinder 70, acting as a second ascend-and-descend means, is also fixed on the shift plate 66. The second cylinder 70 is disposed behind the first cylinder 68 with an adequate clearance, and is parallel to the first cylinder 68 as shown in FIG. 7. The second cylinder 70 has a rod 70a having a lower end fixed to a second squeegee 71 which is brought into contact with the flux 34 on the flat bottom surface 62 when it is shifted to a lowermost position.

The rod 68a of the first cylinder 68 and the rod 70a of the second cylinder 70 are identical with each other in their ascend-and-descend strokes. The height h1 of the first squeegee 69 and the height h0 of the second squeegee 71 are defined by the following equations.

$$h1 = H - L - t1 \quad (1)$$

$$h0 = H - L - t0 \quad (2)$$

where H represents a height from the flat bottom surface 62 to the lower surface of the shift plate 66, L represents a maximum length of the rods 68a and 70a, t1 represents a first film thickness of the flux 34 formed on the flat bottom surface 62, and t2 represents a second film thickness of the flux 34 (t0<t1).

More specifically, one aspect of the squeegee operation of this embodiment situates the rod 70a of the second cylinder 70 in a protruding condition while situating the rod 68a of the first cylinder 68 in a retracted condition as shown in FIG. 7. In this condition, the lower end of the second squeegee 71 is positioned at a second level higher than the flat bottom surface 62 by the second film thickness t0. By shifting the shift plate 68 horizontally from right to left along the flat bottom surface 62, a flux layer having the second film thickness t0 is formed on the flat bottom surface 62.

Furthermore, another aspect of the squeegee operation of this embodiment situates the rod 70a of the second cylinder 70 in a retracted condition while situating the rod 68a of the first cylinder 68 in a protruding condition as shown in FIG. 8. In this condition, the lower end of the first squeegee 69 is positioned at a first level higher than the flat bottom surface 62 by the first film thickness t1. By shifting the shift plate 66 horizontally from left to right, a flux layer having the first film thickness t1 (t0<t1) is formed on the flat bottom surface 62. In this embodiment, the first and second cylinders 68 and 70 act as a level adjusting means Although not shown in the drawing, it is also possible to differentiate each ascend-and-descend stroke of the rods 68a and 70a so as to have a difference equivalent to the difference between the first and second levels, so that the lower end of the first squeegee 69 can be lowered down to the first level by the first cylinder 68 while the lower end of the second squeegee 71 can be lowered down to the second level by the second cylinder 70.

The first film thickness t1 is a thickness suitable for applying the flux 34 to the lower part of the soldering ball 1. The second film thickness t0 is 0.1 to 0.4 times as large as the diameter of the soldering ball 1. It is, however, possible to directly bring the second squeegee 71 into contact with the flat bottom surface 62, thereby forming a film thickness of substantially 0.

Next, a shift means will be explained. In FIG. 6, a feed screw 72 extending in the longitudinal direction is provided on the outside wall of the flux storage 61. The feed screw 72 is rotatably supported. A motor 73 is attached to the end of the feed screw 72 to rotate it. A feed nut 74 is engaged with the feed screw 72. An upper end of the feed nut 74 is fixed to the shift plate 68 through a bracket 75. Accordingly, when the motor 73 is driven, the shift plate 66 carrying both the first squeegee 69 and the second squeegee 71 is shifted in the longitudinal direction of the flux storage 61.

Next, an operation of the soldering ball mounting apparatus in accordance with this embodiment will be explained with reference to FIGS. 7 and 8. First of all, the shift plate 66 is moved along a going path (i.e. from right to left in FIG. 7). More specifically, as shown by a solid line in FIG. 7, the rod 68a of the first cylinder 68 is retracted while the rod 70a of the second cylinder 70 is protruded, thereby positioning the lower end of the second squeegee 71 at the second level higher than the flat bottom surface 62 by the second film thickness t0. Then, the motor 73 is driven to shift the shift plate 66 carrying the second squeegee 69 thereon in the direction of an arrow N2. In this shift movement indicated by the arrow N2, if any soldering ball 1 is left on the flat bottom surface 62, such a soldering ball 1 is pushed aside or wiped away together with the flux 34 by the second squeegee 71 since the second film thickness t0 is smaller than the diameter of the soldering ball 1. The soldering ball 1 thus wiped away is then dropped into the groove 63 when the second squeegee 71 passes above the groove 63. Thus, any soldering balls 1 left on the flat bottom surface 62 can be removed from the flat bottom surface 62. No obstacle no longer remains on the flat bottom surface 62 as shown by a long-and-short dash line in FIG. 7. The depth of the groove 63 is sufficiently deep so that the soldering ball 1 once dropped in this groove 63 cannot interfere with the second squeegee 71 shifting at the height of the second level (t0).

Subsequently, the shift plate 66 is moved along a returning path (i.e. from left to right in the drawing). More specifically, as shown by a solid line in FIG. 8, the rod 70a of the second cylinder 70 is retracted while the rod 68a of the first cylinder 68 is protruded, thereby positioning the lower end of the first squeegee 69 at the first level higher than the flat bottom surface 62 by the first film thickness t1. Then, the motor 73 is driven in the opposite direction to shift the shift plate 66 carrying the first squeegee 69 thereon in the direction of an arrow N3, thereby forming a uniform film layer of flux 34 having the first film thickness t1 on the flat bottom surface 62. Before this returning shift movement is started, traces of soldering balls 1 like scratches may remain on the layer of flux 34 on the flat bottom surface 62 in the event that the soldering balls 1 are forcibly wiped away in the formation of the flux layer of the second film thickness t0. However, such traces or scratches can be repaired during the shift movement of the first squeegee 69 in the direction of arrow N3, since the film thickness (i.e. the first film thickness t1) formed by the first squeegee 69 is larger than the second film thickness t0. Thus, a uniform flux layer of film thickness t1 is surely formed on the flat bottom surface 62 regardless of traces or scratches. Since the lower end of the first squeegee 69 is positioned at the first level higher than the second level, there is no possibility, in the returning movement indicated by the arrow N3, that the first squeegee 69 will collide with the soldering balls 1 captured in the groove 63.

Thereafter, as indicated by an arrow N4 in FIGS. 9 and 6, the absorber head 10 picking up a plurality of soldering balls 1 at its lower surface is lowered onto the flat bottom surface 62, so that the lower part of each soldering ball 1 is soaked in the flux 34 of the first film thickness t1, thereby sufficiently applying the flux 34 to each soldering ball 1.

In turn, as indicated by an arrow N5 in FIGS. 10 and 6, the absorber head 10 is shifted from the flux storage 61 to the substrate 31 clamped on the positioning device 60. That is, each soldering ball 1 applied with the flux 34 is mounted on a corresponding electrode 31a formed on the substrate 31.

Although the present embodiment discloses two independent squeegees 69 and 71, it is also possible to use a single squeegee if the height of the lower end of such a squeegee is adjustable between the first level (t1) and the second level (t0). The arrangement of such a single type squeegee is substantially the same as either of the above disclosed squeegees 69 and 71, and is therefore not shown in the drawing, except that the lower end of the squeegee is positioned at the second level in the going movement to form a flux layer of the second film thickness t0, while the lower end of the squeegee is positioned at the first level in the returning movement to form a flux layer of the first film thickness t1.

As explained in the foregoing description, the present invention can assure that each soldering ball is certainly applied with a proper amount of flux before it is mounted on a workpiece such as a substrate or a chip. Furthermore, the present invention provides a lost soldering ball removing arrangement constituted by the squeegee and the groove formed on the flat bottom surface of the flux storage, thereby surely removing any soldering balls accidentally dropped on the flat bottom surface of the flux storage. Thus, it becomes possible to operate the apparatus for a significantly long time without interruptions.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A soldering ball mounting method comprising the steps of:
    storing flux in a flux storage means having a flat surface and a recess concaved from said flat surface;
    wiping the flux in said flux storage means toward said recess by sliding a squeegee means along said flat surface;
    setting a height of a lower end of said squeegee means at a first level, and causing said squeegee means to slide along said flat surface so as to move away from said recess, thereby forming a flux layer of a desired thickness;
    holding at least one soldering ball by a holder head;
    soaking the soldering ball held by said holder head into the flux stored in said flux storage means, thereby applying flux to a lower part of each soldering ball; and
    mounting said each solder ball onto a corresponding electrode formed on a workpiece after said each solder ball is applied with flux, wherein when the flux in said flux storage means is wiped toward said recess by the squeegee means along said flat surface, any soldering ball left on said flat surface is wiped together with the flux until said soldering ball drops into said recess.

2. The soldering ball mounting method defined by claim 1, wherein the height of the lower end of said squeegee means is changed to a second level lower than said first level when the flux in said flux storage means is wiped toward said recess by the squeegee means along said flat surface.

3. The soldering ball mounting method defined by claim 1, wherein said squeegee means is a single squeegee.

4. The soldering ball mounting method defined by claim 1, wherein said squeegee means comprises first and second squeegees independent from each other, said first squeegee forming the flux layer of the desired thickness while said second squeegee wipes the flux.

5. The soldering ball mounting apparatus defined by claim 1, wherein a gap between said second level and said flat surface is smaller than a diameter of the soldering ball.

6. A soldering ball mounting method comprising steps of:
    forming a plurality of electrodes on a surface of a workpiece;
    storing flux in a flux storage means having a flat surface and a recess concaved from said flat surface;
    flattening a fluid surface of said flux on said flat surface by moving a squeegee along said flat surface;
    holding a plurality of soldering balls by a holder head;
    soaking the soldering balls held by said holder head into the flattened flux in said flux storage means, thereby applying flux to a lower part of each soldering ball; and
    mounting each solder ball onto a corresponding electrode on said workpiece after each solder ball is applied with flux.

7. A soldering ball mounting apparatus comprising:
    a container of soldering balls;
    a positioning means for positioning a workpiece;
    an holder head having a lower surface for picking up and holding at least one soldering ball stored in said container, and mounting said soldering ball onto said workpiece placed on said positioning means;
    a shift means for shifting said holder head along a predetermined transportation path between said container and said positioning means;
    a ascend-and-descend means for lowering and raising said holder head; and
    a flux storage marts provided along said transportation path of said holder means, said flux storage means comprising:
    a flat surface;
    a recess concaved from said flat surface having a capacity capable of collecting solder balls dropped from said holder head onto said flat surface of said flux storage means; and a squeegee movable along said flat surface for spreading flux stored in said flux storage means, thereby smoothing a fluid surface of said flux stored in said flux storage means.

8. A soldering ball mounting apparatus comprising:

a holder head for picking up and transporting soldering balls, said holder head having at least one hole for holding a soldering ball;

a positioning device for positioning a substrate having a surface on which at least one electrode is formed;

a flux storage means for storing flux therein, provided along a transportation path of said holder head, said flux storage means comprising a flat surface and a recess concaved from said flat surface to collect soldering balls left on the flat surface of said flux storage means;

a squeegee for spreading flux on said flat surface;

a shift means for shifting said squeegee along said flat surface; and a level adjusting means for adjusting a height of a lower end of said squeegee by moving said squeegee in an up-and-down direction;

said level adjusting means setting the height of said lower end of said squeegee at a second level when said squeegee moves toward said recess, while said level adjusting means setting the height of said lower end of said squeegee at a first level higher than said second level when said squeegee moves away from said recess, thereby forming a flux layer of a desired thickness on said flat surface of said flux storage means.

9. A soldering ball mounting apparatus comprising:

a holder head for picking up and transporting soldering balls, said holder head having at least one hole for holding a soldering ball;

a positioning device for positioning a substrate having a surface on which at least one electrode is formed;

a flux storage means for storing flux therein, provided along a transportation path of said holder head, said flux storage means comprising a flat surface and a recess concaved from said flat surface;

a shift plate supported on said flux storage means and slidable in a horizontal direction along said flux storage means;

a shift means for shifting said shift plate;

first and second squeegees supported on said shift plate, respectively shiftable in up-and-down direction with respect to said shift plate;

a first ascend-and-descend means provided on said shift plate for lowering said first squeegee until a lower end of said first squeegee reaches a first level when said first squeegee moves away from said recess; and a second ascend-and-descend means provided on said shift plate for lowering said second squeegee until a lower end of said second squeegee reaches a second level lower than said first level when said second squeegee moves toward said recess, wherein said first squeegee and said second squeegee are differentiated in their lengths in the up-and-down direction by an amount identical with a difference between said first and second levels, and a stroke of said first ascend-and-descend means for lowering said first squeegee is identical with a stroke of said second ascend-and-descend means for lowering said second squeegee.

10. A soldering ball mounting apparatus comprising:

a holder head for picking up and transporting soldering balls, said holder head having at least one hole for holding a soldering ball;

a positioning device for positioning a substrate having a surface on which at least one electrode is formed;

a flux storage means for storing flux therein, provided along a transportation path of said holder head, said flux storage means comprising a flat surface and a recess concaved from said flat surface;

a shift plate supported on said flux storage means and slidable in a horizontal direction along said flux storage means;

a shift plate for shifting said shift plate;

first and second squeegees supported on said shift plate, respectively shiftable in up-and-down direction with respect to said shift plate;

a first ascend-and-descend means provided on said shift plate for lowering said first squeegee until a lower end of said first squeegee reaches a first level when said first squeegee moves away from said recess; and a second ascend-and-descend means provided on said shift plate for lowering said second squeegee until a lower end of said second squeegee reaches a second level lower than said first level when said second squeegee moves toward said recess, wherein said first squeegee and said second squeegee are identical with each other in their lengths in the up-and-down direction, and a stroke of said first ascend-and-descend means for lowering said first squeegee is differentiated from a stroke of said second ascend-and-descend means for lowering said second squeegee by an amount identical with a difference between said first and second levels.

11. A soldering ball mounting apparatus comprising:

a holder head for picking up and transporting soldering balls, said holder head having at least one hole for holding a soldering ball;

a positioning device for positioning a substrate having a surface on which at least one electrode is formed;

a flux storage means for storing flux therein, provided along a transportation path of said holder head, said flux storage means comprising a flat surface and a recess concaved from said flat surface to collect soldering balls left on the flat surface of said flux storage means;

a shift plate supported on said flux storage means and slidable in a horizontal direction along said flux storage means;

a shift means for shifting said shift plate;

first and second squeegees supported on said shift plate, respectively shiftable in an up-and-down direction with respect to said shift plate;

a first ascend-and-descend means provided on said shift plate for lowering said first squeegee until a lower end of said first squeegee reaches a first level when said first squeegee moves away from said recess to form a flux layer of desired thickness on said flat surface of said flux storage means; and a second ascend-and-descend means provided on said shift plate for lowering said second squeegee until a lower end of said second squeegee reaches a second level lower than said first level when said second squeegee moves toward said recess.

12. The soldering ball mounting apparatus defined by claim 11, wherein a gap between said second level and said flat surface is smaller than a diameter of the soldering ball.

* * * * *